United States Patent [19]
Kaloyeros et al.

[11] Patent Number: 6,077,571
[45] Date of Patent: *Jun. 20, 2000

[54] CONFORMAL PURE AND DOPED ALUMINUM COATINGS AND A METHODOLOGY AND APPARATUS FOR THEIR PREPARATION

[75] Inventors: Alain E. Kaloyeros, Voorheesville; Jonathan Faltermeier, Clifton Park, both of N.Y.

[73] Assignee: The Research Foundation of State University of New York, Albany, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 08/574,943

[22] Filed: Dec. 19, 1995

[51] Int. Cl.$^7$ .................................................. C23G 16/20
[52] U.S. Cl. ......................... 427/576; 427/252; 427/253; 427/255.7; 427/376.7; 438/680; 438/681; 438/687; 438/688
[58] Field of Search .................................... 427/250, 252, 427/253, 255.7, 376.7, 571, 99, 124, 576; 437/245; 438/584, 652, 661, 668, 680, 681, 687, 688

[56] References Cited

U.S. PATENT DOCUMENTS

| | | | |
|---|---|---|---|
| 4,849,260 | 7/1989 | Kusumoto et al. ...................... | 427/250 |
| 4,976,996 | 12/1990 | Monkowski et al. ................. | 427/255.5 |
| 5,087,485 | 2/1992 | Cho ......................................... | 427/253 |
| 5,091,210 | 2/1992 | Mikoshiba et al. . | |
| 5,154,949 | 10/1992 | Shindo et al. ........................... | 427/253 |
| 5,273,775 | 12/1993 | Dyer et al. ................................. | 427/99 |
| 5,376,409 | 12/1994 | Kaloyeros et al. ................... | 427/248.1 |
| 5,453,305 | 9/1995 | Lee ......................................... | 427/562 |
| 5,464,666 | 11/1995 | Fine et al. ............................... | 427/576 |

OTHER PUBLICATIONS

H. O. Pierson, "Aluminum Coatings By The Decomposition of Alkyls*", *Thin Solid Films*, 45, pp. 257–263, (1977) Europe. (No Month).

B. E. Bent, R. G. Nuzzo, and L. H. Dubois, "Surface Organometallic Chemistry In The Chemical Vapor Deposition Of Aluminum Films Using Triisobutylaluminum: =–Hydride and β–Alkyl Elimination Reactions of Surface Alkyl Intermediates", *J. Am. Chem. Soc.*, III, pp. 1634–1644 (1989) New Jersey. (No Month).

A. W. Edith Chan and R. Hoffmann, "From Chemisorption To Mechanism On Surfaces: An Exploration Of The Pyrolysis Of Tyiisobutylaluminum In The Chemical Vapor Deposition Of Aluminum Thin Films", *J. Vac. Sci. Technol.*, A, vol. 9, No. 3, pp. 1569–1580, (1991) New York. (No Month).

(List continued on next page.)

*Primary Examiner*—Timothy Meeks
*Attorney, Agent, or Firm*—Heslin & Rothenberg, P.C.

[57] ABSTRACT

The present invention relates to a process and apparatus for the formation of conformal pure aluminum and doped aluminum coatings on a patterned substrate. It is directed to the use of low temperature thermal and plasma-promoted chemical vapor deposition techniques with biased substrate to provide conformal layers and bilayers comprised of pure Al and/or doped Al (e.g., Al with 0.5 at % copper) on semiconductor device substrates with patterned holes, vias, and trenches with aggressive aspect ratios (hole depth/hole width ratios). The use of the plasma-promoted CVD (PPCVD) process, which employs low plasma power densities, allows the growth of aluminum films with the smooth surface morphology and small grain size necessary for ULSI applications, while substrate bias provides superior coverage and complete aluminum fill of features intrinsic in microelectronic device manufacture. Aluminum doping is achieved by in-situ deposition by PPCVD of sequential bilayers of Al and Cu followed by in-situ annealing, or in-situ simultaneous PPCVD deposition of copper-doped aluminum.

25 Claims, 9 Drawing Sheets

OTHER PUBLICATIONS

W. L. Gladfelter, D. C. Boyd, and K. F. Jensen, "Trimethylamine Complexes of Alane As Precursors For The Low-Pressure Chemical Vapor Deposition Of Aluminum", *Chemistry Of Materials*, vol. 1, No. 3, pp. 339–343, (1989) Minnesota. (No Month).

E. Kondoh, Y. Kawano, N. Takeyasu, and T. Ohta, "Interconnection Formation By Doping Chemical–Vapor–Deposition Aluminum With Copper Simultaneously: Al–Cu CVD", *J. Electrochem. Soc.*, vol. 141, No. 12, pp. 3494–3499, (1994) Japan. (No Month).

R. A. Levy, P. K. Gallagher, R. Contolini, and F. Schrey, "Properties of LPCVD Aluminum Films Produced By Disproportionation Of Aluminum Monochloride", *J. Electrochem. Soc.*, vol. 132, No. 2, pp. 457–463, (1985) New Jersey. (No Month).

A. Weber, U. Bringmann, K. Schiffmann, and C. P. Klages, "Influence Of RF Plasma On the Nucleation of Aluminum Using N–Trimethylamine–Alane (TMAA) As Precursor", *Mat. Res. Soc. Symp. Proc.*, vol. 282, pp. 311–316, (1993) Germany. (No Month).

M. E. Gross, L. H. Dubois, R. G. Nuzzo, and K. P. Cheung, "Metal–Organic Chemical Vapor Deposition Of Aluminum From Trialkylamine Alanes", *Mat. Res. Soc. Symp. Proc.*, vol. 204, pp. 383–390, (1991) New Jersey. (No Month).

A. S. Russell, K. E. Martin, and C. N. Cochran, "Equilibrium And Rate Of Aluminum Monochloride Formation From Aluminum Chloride And Aluminum", vol. 73, pp. 1466–1469, (1951). (No Month).

D. B. Beach, S. E. Blum, and F. K. LeGoues, "Chemical Vapor Deposition Of Aluminum From Trimethylamine–Alane", *J. Vac. Sci. Technol.* A, vol. 7, No. 5, pp. 3117–3318 Sep./Oct., (1989) New York.

M. J. Cooke, R. A. Heinecke, R. C. Stern, and J. W. C. Maes, "LPCVD Of Aluminum And Al–Si Alloys For Semiconductor Metallization", *Solid State Technology*, pp. 62–65, Dec., (1982) Europe.

M. E. Gross, K. P. Cheung, C. G. Fleming, J. Kovalchick, and L. A. Heimbrook, "Metalorganic Chemical Vapor Deposition Of Aluminum From Trimethylamine Alane Using Cu and TiN Nucleation Activators", *J. Vac. Sci. Technol.* A, vol. 9, No. 1, pp. 57–64, Jan./Feb., (1991) New Jersey.

CONFORMAL PURE AND DOPED ALUMINUM COATINGS AND A METHODOLOGY AND APPARATUS FOR THEIR PREPARATION

FIELD OF THE INVENTION

The present invention relates to conformal pure aluminum and doped aluminum coatings on a patterned substrate and a methodology and apparatus to prepare such coated substrate. More particularly, the present invention is directed to the use of low temperature thermal and plasma-promoted chemical vapor deposition techniques to provide conformal layers and bilayers comprised of pure Al and/or doped Al (e.g., Al with 0.5 at % copper) on semiconductor device substrates with patterned holes, vias, and trenches with aggressive aspect ratios (hole depth/hole width ratios).

BACKGROUND OF THE INVENTION

Aluminum, as a metallization material, has been one of the key factors in the success of solid-state semiconductor circuits. It readily reduces the native oxide on silicon surfaces at low temperatures (<500° C.) and thus forms excellent contact with silicon and, for the same reasons, bonds very well with silicon dioxide ($SiO_2$) and $SiO_2$-based glasses. However, incorporating aluminum in emergency ultra-large scale integration (ULSI) computer chip devices has encountered several problems. One is material reliability due to aluminum's low melting point. Aluminum reacts strongly with silicon and easily migrates through silicon. Another problem is process reliability. Present physical vapor deposition (PVD) processes, of which sputtering is the most popular, cannot meet the increasingly stringent requirements of new multilevel metallization schemes. Sputtering produces non-conformal coverage, which leads to thinning at via and trench edges and walls, and to keyholes in the via. In addition, the deposits, grown at or near room temperature, almost invariably are contaminated with trapped-in sputter gas and possess small grain size. Both features are detrimental to the reliability of aluminum interconnections. Higher temperature deposition solves some of these problems. However, thermally-fragile low dielectric constant ($\epsilon$<2) polymers, which are considered for applications as interlayer and passivating dielectric to enhance the performance of integrated circuits, are destroyed during high temperature processes.

In spite of these problems, aluminum's use is expected to continue in ULSI and beyond, as documented by the Semiconductor Industry Association (SIA) industry wide technology roadmap. See *The National Technology Roadmap for Semiconductors* (SIA, San Jose, Calif., 1994). This expectation is contingent upon the development of new aluminum alloys and deposition techniques which eliminate the inherent problems encountered in PVD processes.

Chemical vapor deposition (CVD) potentially offers a solution to all these problems. CVD deposits a thin solid film synthesized from the gaseous phase by a chemical reaction which could be activated thermally or electrically and/or catalyzed by the substrate to be coated. It is this reactive process which distinguishes CVD from physical deposition processes, such as sputtering or evaporation. CVD is used to deposit layers of silicon, silicon dioxide and silicon nitride. CVD is not used to deposit metals on semiconductor substrates. One of the key advantages of CVD is its potential ability to involve the substrate surface in the deposition reaction which leads, under the proper conditions, to a conformal, planarized blanket, or selective metal growth. This conformed feature is an essential requirement to produce three-dimensional multilevel structures which contain interconnections in the vertical direction through vias and holes in the dielectric layers. Another advantage of CVD is that it can deposit layers on substrates of complex shape and form the layers at growth rates which are much higher than the minimum acceptable in electronic device industry. In addition, it can grow metal thin films at reduced temperatures, as low as 150° C., with no need for post-deposition annealing. This is necessary to minimize the effects of interdiffusion and to allow the growth of abrupt multilayered structures. It is relatively simple and controllable, and leads to good adherence, high uniformity over a large area, and reduced susceptibility to interfacial mixing and cross-contamination effects.

In recent years, considerable efforts have been devoted to the development of CVD processes for depositing aluminum layers on substrates, in particular semiconductor substrates. Earlier attempts at aluminum CVD used tri-alkyl-type sources, such as trimethyl and triethylaluminum, and produced deposits with extensive surface roughness, high resistivity, and large amounts of carbon, all of which being detrimental to microelectronic applications. See, e.g., C. F. Powell, J. H. Oxley, and J. M. Blocher, Jr., *Vapor Deposition* (Wiley, New York, N.Y. 1966) p. 277; and H. J. Cooke, R. A. Heinecke, R. C. Stern, and J. W. C. Maas, *Solid State Technol.* 25 (1982) 62. Also, the pyrophoric nature of the alkyl source precursors required extensive precautionary measures. These earlier attempts used relatively high temperatures, increased reactor pressure, and did not use hydrogen.

To avoid these problems, attempts were made to grow aluminum through hydrogen reduction of aluminum halides, such as $AlCl_3$ and $AlBr_3$, or through disproportionation of aluminum subchlorides. See, e.g., W. Klemm, E. Voss, and K. Geigersberger, *Z. Anorg. Allg. Chemie* 256 (1948) 15; and A. S. Russel, K. E. Martin, and C. N. Cochran, *Am. Chem. Soc.* 73 (1951) 1466. Precursor transport to the reaction zone required however prohibitively high temperatures (>700° C.) and made the process impractical.

More recently, several reports were published on the formation of a sensitizing layer on $SiO_2$ prior to aluminum CVD and on the use of new organoaluminum source precursors, such as triisobutylaluminum (TIBA) and trimethylamine-alane (TMAAl). See, e.g., R. A. Levy, P. K. Gallagher, R. Contolini, and F. Schrey, *J. Electrochem. Soc.* 132 (1985) 457; B. E. Bent, R. G. Nuzzo, and L. H. Dubois, *J. Am. Chem. Soc.* 111 (1989) 1634, and H. O. Pierson, *Thin Solid Films*, 45 (1977) 257; M. E. Gross, K. P. Cheung, C. G. Fleming, J. Kovalchick, and L. A. Heimbrok, *J. Vac. Sci. Technolo.* A9 (1991) 1; M. E. Gross, L. H. Dubois, R. G. Nuzzo, and K. P. Cheung, *Mat. Res. Symp. Proc.*, Vol 204 (MRS, Pittsburgh, Pa., 1991) p. 383; W. L. Gladfelter, D. C. Boyd, and K. F. Jensen, *Chemistry of Mater.* 57 (1989) 339; D. B. Beach, S. E. Blum, and F. K. LeGoues, *J. Vac. Sci. Technol.* A7 (1989) 3117. In addition, NTT in Japan announced the development of a multilayer wiring technique based on a selective Al CVD process. However, the process requires high vacuum capabilities of rf plasma pre-cleaning for in-situ impurity removal from the inner surface of the via holes.

In spite of all attempts, only a few of which have been cited here, low-temperature (<475° C.) CVD of device-quality aluminum is not yet feasible. Some particular problems encountered include prohibitive surface roughness, impurity contamination (especially oxygen and carbon which bond well to aluminum), high deposition temperature, and the lack of sensitized layers that allows precursor decomposition on initial, insulating, surfaces. In addition, as discussed below, prior CVD methods fail to provide device-quality aluminum and aluminum-copper alloys with conformal step coverage for substrates having aggressive holes and trenches (i.e., with a diameter of 0.25 μm μm or smaller) and high aspect ratios (i.e., the ratio of hole depth to hole width equal to or greater than about 4:1).

So, there is a long felt, critical need for a process and apparatus to provide specular and pure aluminum and doped aluminum (aluminum with a few percent of other elements, such as copper) films suitable for ULSI fabrication. A typical, specular aluminum film has a grain size below a few thousand angstroms. Such films must be of ultra high quality, in terms of purity, with impurity concentrations well below 1 atomic percent, must exhibit excellent electromigration properties, must be highly specular, with extremely smooth surface morphology, and must be conformal to the complex topography of ULSI circuity to provide complete filling of aggressive via and trench structures. The desired process and apparatus should readily prepare single films containing either aluminum or copper doped aluminum, as well as bilayer films of aluminum and copper, and that such technology be amenable to process temperatures below about 475° C. to prevent thermally induced devices damage during processing.

Copper doping is required to enhance aluminum's resistance to electromigration. This could be achieved through sequential deposition of aluminum then copper, followed by annealing or rapid thermal processing (RTP) to alloy the two films and produce a homogeneous copper-doped aluminum phase. However, work was recently published on the CVD formation of aluminum films doped with 0.7–1.4 wt % copper through the simultaneous decomposition in the same CVD reactor of dimethylaluminum hydride (DMAH) and cyclopentadienyl copper triethylphosphine which were employed, respectively, as the aluminum and copper sources. See T. Katagiri, E. Kondoh, N. Takeyasu, T. Nakano, H. Yamamoto, and T. Ohta, *Jpn. J. Appl. Phys.* 32 (1993)L1078 and *J. Electrochem. Soc.* 141 (1994) 3494. Unfortunately, the copper source used in the work was highly reactive and unstable during transport and handling, which makes it undesirable for real industrial applications. The references fail to disclose plasma assisted CVD and the substrate that receives the copper is not electrically biased. Clearly, there is critical need for stable copper sources which are free of oxygen, fluorine, and halides, and which are compatible with aluminum precursors to prevent any cross-contamination effects during film growth.

It is especially desirable that the process and apparatus allows for the preparation of the above-mentioned films in-situ, i.e., without the necessity of transferring a substrate coated with a single film (Al or Cu) to another reaction chamber to deposit the other film. As is known in the art, a process which allows either in-situ deposition of sequential bilayers of Al and Cu followed by in-situ annealing, or in-situ simultaneous deposition of copper-doped aluminum is desirable in part because of the high affinity of aluminum for oxygen. This affinity leads typically to contamination of the Al film surface during transfer to a second reaction chamber where it is coated with Cu. The oxidized aluminum surface interferes with annealing of aluminum and copper.

SUMMARY OF THE INVENTION

The invention includes a method and apparatus for the chemical vapor deposition of conformal metal layers on substrates. In particular, the invention deposits aluminum metalization layers on semiconductor substrates such as silicon and gallium arsenide. The invention deposits other metal layers, such as copper. The invention deposits of two or more metals either simultaneously or sequentially. Thus, the invention, can form an alloy of two or more metals simultaneously with the deposition of a single alloy layer. As an alternative, one may deposit, in-situ, sequential, separate layers of two or more metals. With the invention sequentially deposited layers are annealed to form an alloy layer. The annealing step takes place in-situ in the reactor without removing the substrate therefrom.

The invention provides a low temperature, heat assisted chemical vapor deposition process and apparatus. With the invention, aluminum, or copper, or both, are deposited on the substrate. This process is carried out by using aluminum and/or copper precursor gases. The precursor gases are reacted with hydrogen or other suitable reactant gases. The reaction takes place in a reactor under a vacuum and at a temperature less than 500° centigrade.

The invention electrically assists chemical vapor deposition. An electrical bias is applied to the substrate. The electrical bias may be less than 10 watts and at a frequency less than 500 kHz. The local electrical field in the region of the surface of the substrate likely enhances the chemical reaction between the reactant gas and the aluminum or copper precursor gas so that the metal is released from the precursor and deposited on the substrate.

The invention is also a plasma assisted chemical vapor deposition process. The invention uses plasmas of relatively small power to deposit metal films. Substantially any suitable precursor gas and reactant gas can be used in order to deposit conformal metal films with plasma assisted chemical vapor depositions. A metal precursor gas and a reactant gas are mixed in a reactor. The reactor is under a vacuum and may be heated to a temperature less than 250° centigrade. A relatively small plasma is created by electrodes disposed on either side of the substrate. The plasma may be as small as a plasma in the range between 0.005 and 2.5 watts per centimeters square. The plasma interacts with reactant gas to form a plasma of the reactant gas. The plasma of the reactant gas likely enhances the release of metal from the metal precursor gas. Suitable aluminum or copper metal precursor will work with any suitable reactant gas, such as hydrogen, helium, argon, xenon, nitrogen, or a mixture thereof.

Two key aspects of the invention are: (a) the use of a low power density plasma, which promotes precursor decomposition at lower temperatures than thermal CVD without undesirable side effects, and (b) the application of substrate bias which serves a dual role. Its first role, it turns out, is the actual formation of a "soft" plasma region just above the wafer which also promotes decomposition. Its second role is to attract the ionized Al species to the various topographical region of the substrate, leading to conformal via and trench filling. Accordingly, under appropriate plasma and/or substrate bias conditions, all chemical sources are expected to work.

BRIEF DESCRIPTION OF THE DRAWINGS

The foregoing summary, as well as the following detailed description of preferred embodiments of the invention, will be better understood when read in conjunction with the appended drawings. The invention is illustrated in embodiments shown in the drawings. It should be understood, however, that the invention is not limited to the precise arrangements and instrumentalities shown.

DETAILED DESCRIPTION OF THE PREFERRED EMBODIMENTS

The invention includes CVD-based processes that deposit aluminum and copper-doped aluminum films which are suitable as signal conductors (both plug and interconnect) in integrated circuit fabrication, and, in particular in ULSI fabrication. The invention directs selected precursors to a thermal or plasma promoted CVD reactor, under specified reaction conditions, to deposit high quality metal films including layers of aluminum, copper, and aluminum alloys.

As used herein, the term "aluminum film" refers to a film made from pure aluminum metal. Also, the term "doped aluminum film" is used to refer to a film made from blends of aluminum metal and a second metal which is selected from Groups Ib, IIb and VIIIb of the Periodic Table, such as copper. Also the term "bilayered aluminum film" refers to bilayers formed from any of aluminum metal, copper metal and blends thereof, which are subsequently annealed to yield an aluminum-copper alloy.

According to one embodiment of the present invention, aluminum-based films form at low temperatures and have smooth surface morphology by using plasma promoted chemical vapor deposition (PPCVD). As used herein PPCVD refers to a CVD process wherein all reactants are introduced to the CVD reactor in gaseous form, and the energy necessary for bond cleavage is supplied partially by the high energy electrons formed in glow discharges or plasmas with low plasma power densities (below 0.25 W/cm$^2$). This technique takes advantage of the high energy electrons present in glow discharges to assist in the dissociation of gaseous molecules, as is the case with plasma enhanced CVD (PECVD), thus leading to film formation at lower substrate temperatures than in thermal CVD processes. However, in contrast to PECVD which uses high plasma power densities, the low power densities employed in PPCVD prohibit electron- and ion-induced precursor fragmentation and substrate and film damage, thus producing films with electronic-grade purity and reduced stress levels. According to the preferred method, the plasma is generated through use of radio frequency (RF) glow discharges, although plasmas with frequencies ranging from kHz to GHz could be employed. See, generally, Hess, D. W. and Graves D. B., "Plasma-Assisted Chemical Vapor Deposition", chapter 7 in "Chemical Vapor Deposition, Principles and Applications," Hitchman, M. L. and Jensen, K. F. eds., Academic Press (1993).

The PPCVD reactor of the invention has several basic components: a precursor delivery system which stores and controls the delivery of the source precursor, a vacuum chamber and pumping system that maintains an appropriately reduced pressure; one power supply that creates the discharge; another power supply to apply a bias to the substrate; a temperature control system; and gas or vapor handling capabilities to meter and control the flow of reactants and products that result from the process.

Figure 1:
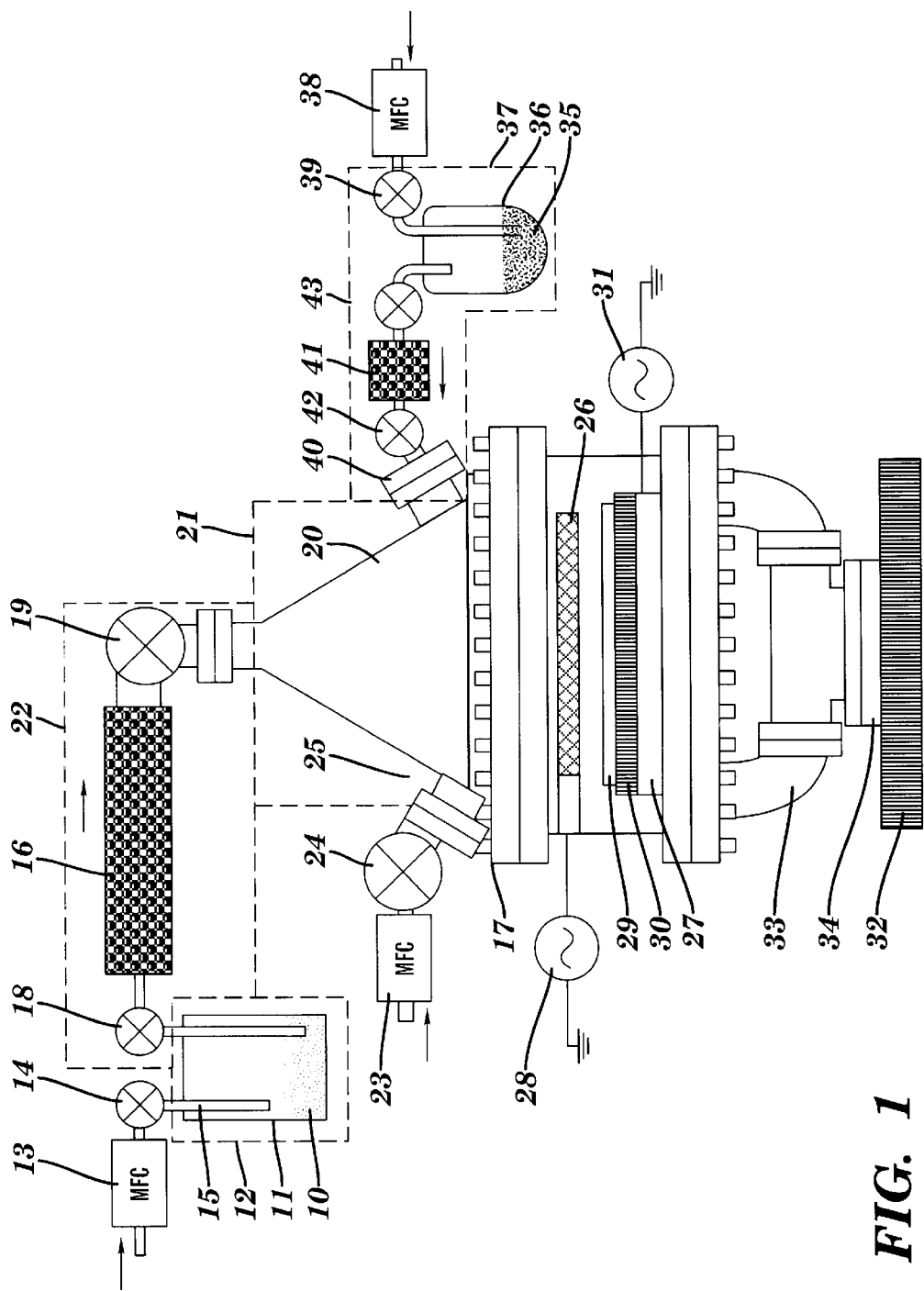
FIG. 1 is a diagrammatic representation of the reaction apparatus used to achieve chemical vapor deposition and plasma promoted chemical vapor deposition according to the present invention.

FIG. 1 shows the inventive CVD reactor. The aluminum source precursor 10 is placed in the reservoir (bubbler/sublimator) 11 which could be heated by a combination resistance heating tape and associated power supply 12 to a temperature which is high enough to ensure the sublimation or vaporization of the aluminum source, but not too high to cause its premature decomposition. A mass flow controller 13, which can be isolated from the bubbler by a high vacuum valve 14, controls the flow of gas (hydrogen, argon, xenon, or nitrogen) into the reservoir through inlet 15. This gas from reservoir 11 serves as carrier agent when a conventional pressure or temperature based mass flow control type delivery system 11 and 13 is employed to control the flow of precursor into the CVD reactor 17. Alternatively, the gas serves as a pressurizing agent when a liquid delivery system 16, consisting of a combination micropump and vaporizer head, such as the MKS Direct Liquid Injection (DLI) system, is used to deliver the precursor to the CVD reactor 17. A third possibility is to use a hot source mass flow controller 16, such as an MKS Model 1150 MFC, which does not require the use of a carrier or pressurizing gas. In any case, the precursor delivery system is isolated from the precursor reservoir 11 by a high vacuum valve 18, and the precursor vapor or (precursor+carrier gas) mixture vapors is then transported through a high vacuum isolation valve 19 and a cone-shaped shower head 20 into the CVD reactor 17. The shower head 20 is employed to ensure proper reactant mixing and uniformity in reactant delivery and flow over 8" wafers. In one embodiment, the cone was 18" high, and was designed with conflat type top and bottom fittings. The bottom opening (towards the reactor) was 7", while the top opening was 1.3". All transport and delivery lines and high vacuum isolation valves 18, 19, and 20 are maintained at the precursor sublimation/vaporization temperature, using typical combinations of resistance heating tapes and associated power supplies 21 and 22, to prevent precursor recondensation.

The reactor 17 is an 8" wafer, cold wall stainless steel CVD reactor. It is equipped with a parallel plate type plasma configuration made of two electrodes 26 and 27, with the reactor itself providing electrical grounding. The upper plate 26 serves as the active discharge electrode and is driven by a plasma generator 28, such as a radio frequency (13.56 MHz) power supply. This upper plate is constructed in a "mesh" type pattern to allow unconstricted reactant flow to the substrate 29. In all cases, a hydrogen plasma is used for in-situ pre-deposition substrate cleaning at plasma power densities in the range 0.005 to 2.5 W/cm$^2$, while a plasma consisting of hydrogen, an argon-hydrogen, or nitrogen-hydrogen mixture is employed during PPCVD of Al and doped Al film growth. No plasma is employed during thermal CVD deposition. A mass flow controller 23, which can be isolated from the bubbler by a high vacuum valve 24, is used to ensure delivery of additional hydrogen, argon, or nitrogen flow to the reactor through the side feedthrough 25. The substrate (wafer) 29 is placed on the lower electrode 27, and is heated to processing temperatures in the range 70–450° C. by an 8" resistive heater 30. The lower plate also serves as the bias electrode and could be driven by a frequency generator 31, such as a low frequency (95–450 kHz) power supply, when, according to some preferred embodiments, thermal or plasma promoted CVD with biased substrate are used.

To guarantee process cleanliness, the reactor is periodically baked under a nitrogen, argon, or hydrogen atmosphere to below 0.3 Torr and then pumped down to below $10^{-7}$ Torr for an hour at 150° C. The pumping stack 32 consists of two pumping packages, the first cryogenic or turbomolecular pump based, and the second roots blower pump based, and is isolated from the reactor high conductance pumping lines 33 by the high vacuum gate valve 34. The cryogenic pump based package is used to ensure high vacuum base pressure in the reactor, while the roots blower based package is employed for appropriate handling of the high gas throughput during actual CVD runs. A high vacuum load lock system is typically used for transport and loading of 8" wafers into the reactor.

In the case of copper doped aluminum films, the copper source precursor 35 is placed in the reservoir (bubbler/sublimator) 36 which could be heated by a combination resistance heating tape and associated power supply 37 to a temperature which is high enough to ensure the sublimation or vaporization of the copper source, but not too high to cause its premature decomposition. A mass flow controller 38, which can be isolated from the bubbler by a high vacuum valve 39, is used to control the flow of gas (hydrogen, argon, xenon, or nitrogen) into the reservoir through inlet 40. This gas serves as carrier agent when a conventional pressure or temperature based mass flow, control type delivery system 36 and 38 is employed to control the flow of precursor into the CVD reactor 17. Alternatively, the gas serves as a pressurizing agent when a liquid delivery system 41, consisting of a combination micropump and vaporizer head, such as the MKS Direct Liquid Injection (DLI) system, is applied to the delivery of the precursor to the CVD reactor 17. A third possibility is to use a hot source mass flow controller 41, such as an MKS Model 1150 MFC, which does not require the use of a carrier or pressurizing gas. In any case, the delivery system is isolated from the precursor reservoir by a high vacuum valve 42, and the precursor vapor or (precursor+carrier gas) mixture vapors is then transported through a high vacuum isolation valve 19 and a cone-shaped shower head 20 into the CVD reactor 17. All transport and delivery lines and high vacuum isolation valves 39, 40, and 42, are maintained at the copper precursor sublimation/vaporization temperature, using a typical combination of resistance heating tape and associated power supply 43, to prevent precursor recondensation.

We have discovered that the use of a plasma-promoted CVD (PPCVD) process allows the growth of aluminum films with the smooth surface morphology and small grain size necessary for ULSI applications. This discovery is in agreement with the results observed for plasma enhanced CVD (PECVD) processes. See, for example, A. Weber, U. Bringmann, K. Schifftnann, and C. P. Klages, *Mat. Res. Symp. Proc.* 282 (1993) p. 311. However, PECVD employs glow discharges or plasmas with high power densities. Such high densities cause undesirable gas phase precursor fragmentation, leading to significant film contamination with carbon, nitrogen, and other elements from the source precursor, and prohibiting use of the resulting film in computer chip technologies. In contrast, our PPCVD process employs low plasma power densities (between 0.005 and 2.5 W/cm$^2$). Such low power densities prohibit undesirable electron- and ion-induced precursor fragmentation and lead to the growth of films with electronic-grade purity and reduced stress levels.

While not wishing to be bound by theory, we offer the following explanation for the efficacy of our process. In our method, the plasma provides a high concentration of the reactive hydrogen species which play a dual role:

They act as reducing agent which bonds with the free ligands and various hydrocarbon fragments resulting from precursor decomposition, thus preventing them from recombining with the aluminum atoms and getting incorporated in the growing film. The result is a pure aluminum film which is free of any oxygen or carbon impurities from the precursors.

Additionally, these reactive hydrogen species provide an in-situ means for substrate surface pre-deposition treatment. This treatment decreases the nucleation barrier. In CVD processing, the substrate surface plays a critical role in "catalyzing" the reaction that leads to precursor decomposition and film nucleation and growth. When the substrate surface is not properly cleaned or "conditioned" prior to deposition, surface contaminants may act as nucleation barriers by preventing precursor adsorption and decomposition. Another factor that contributes to the so-called nucleation barrier is surface defects. A surface treated with hydrogen provides a uniform seed layer for aluminum grain formation, thus leading to the formation of aluminum films with smooth surface morphology. It is important to produce films with a grain size which is not too small as to cause poor electrical performance (due to electron scattering at the grain boundaries) but which is not too large to lead to poor via and trench fill and unacceptable surface roughness.

We have also discovered that, in contrast to other chemical vapor deposition methods, our method provides superior coverage and complete aluminum fill of features intrinsic in microelectronic device manufacture. This superior coverage is achieved by combining PPCVD with substrate bias.

Substrate bias significantly enhances the flux of aluminum ions impinging on the substrate and a increases in the re-emission probability of such atoms inside via and trench structures. These re-emission processes improve step coverage in patterned holes, vias, and trenches with aggressive aspect ratios (0.25 $\mu$m features with 4 to 1 aspect ratios and beyond).

We have also discovered that the aluminum and copper delivery systems can be combined to produce copper-doped aluminum films can be prepared by PPCVD in-situ, i.e., without the necessity of transferring a substrate coated with a single film (Al or Cu) to another reaction chamber to deposit the other film. This approach allows either in-situ deposition by PPCVD of sequential bilayers of Al and Cu followed by in-situ annealing, or in-situ simultaneous PPCVD deposition of copper-doped aluminum. Our process can also be applied to coatings for refractive, mechanical, optoelectronic, or decorative applications in applications other than microelectronic.

The following examples are set forth as a means of illustrating the present invention and are not to be construed as a limitation thereon. All chemical vapor deposition studies were conducted in the custom designed cold-wall aluminum reactor described above and having a single 8 inch wafer, a parallel plate-type plasma configuration, and a load locked wafer transport system, as shown diagrammatically in FIG. 1.

EXAMPLE 1

Preparation of Al Films by Thermal CVD using DMAH and $H_2$

Thermal chemical vapor deposition was carried out with the reactor shown in FIG. 1, using dimethyl aluminum hydride (DMAH) as the aluminum source. The DMAH precursor 10 was placed in the bubbler/sublimator 11 which was heated by a combination constant temperature oil bath and associated power supply 12 to temperatures between 20 and 40° C., during the CVD process. An MKS Model 1150 manufactured by MKS of Andover, Mass. hot source mass flow controller 16, which can be isolated from the bubbler by a high vacuum valve 18, controlled a flow of 0–10 sccm of the DMAH precursor into the CVD reactor. All transport and delivery lines and high vacuum isolation valves 18, 19, and 20 were maintained at temperatures in the range 30 to 60° C., using a combination heating tape and associated power supply 21 and 22, to prevent precursor recondensation.

The reactor was an 8" wafer, cold wall stainless steel CVD reactor. It was equipped with a parallel plate type plasma configuration made of two electrodes 26 and 27 with the reactor itself providing electrical grounding. The upper plate 26 served as the active electrode and was driven by the radio frequency (13.56 MHz) power supply 28. It was constructed in a "mesh" type pattern to allow unconstricted reactant flow to the substrate. A hydrogen plasma was used for in-situ pre-deposition substrate cleaning at plasma power densities in the range 0.05–0.25 W/cm$^2$, while no plasma was employed during actual deposition for thermal CVD. The substrate (wafer) was placed 0on the lower electrode 27, which was not biased in this case, and was heated to processing temperatures in the range 150–225° C. by an aluminum-encapsulated resistive heater 30. The cone shaped shower head 20 was employed to ensure proper reactant mixing and uniformity in reactant delivery and flow over 8" wafers.

To guarantee process cleanliness, the reactor was periodically baked under a hydrogen atmosphere to below 0.2 Torr and then pumped down to below 10$^{-7}$ Torr for an hour at 150° C. The pumping stack 32 consisted of two pumping packages, the first is turbomolecular pump based, and the second roots blower pump based, and was isolated from the reactor by the high vacuum gate valve. The turbomolecular pump based package was used to ensure high vacuum base pressure in the reactor, while the roots blower based package was employed for appropriate handling of the high gas throughput during actual CVD runs. A high vacuum load lock system was used for transport and loading of 8" wafers into the reactor. Finally, a side line 25 was employed to feed the hydrogen gas into the reactor. The $H_2$ flow of 100 to 1000 sccm was controlled by a mass flow controller 23 and associated isolation valve 24.

The Al films thus produced were metallic, continuous, and silver colored. Their structural and electrical properties as well as chemical composition, were thoroughly analyzed by x-ray diffraction (XRD), Auger electron spectroscopy (AES), x-ray photoelectron spectroscopy (XPS), Rutherford backscattering (RBS), four point resistivity probe, and cross-sectional SEM (CS-SEM).

Figure 2:
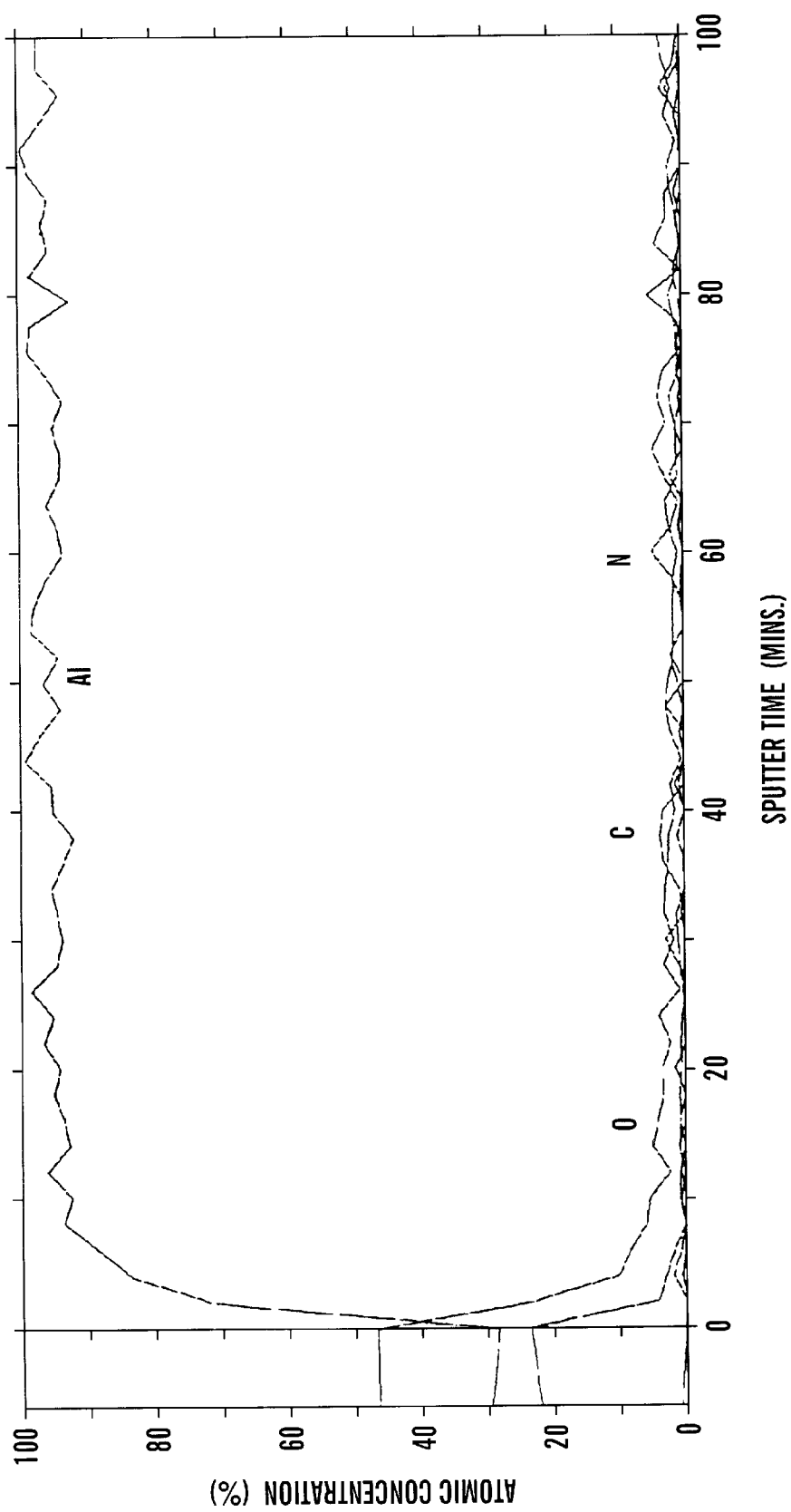
FIG. 2 is an x-ray photoelectron spectroscopy (XPS) spectrum of an aluminum film produced by thermal CVD reaction of dimethyl aluminum hydride (DMAH) and hydrogen. XPS results indicate a pure Al phase with no light element (e.g., C, O, F, etc.) contamination.
Figure 3:
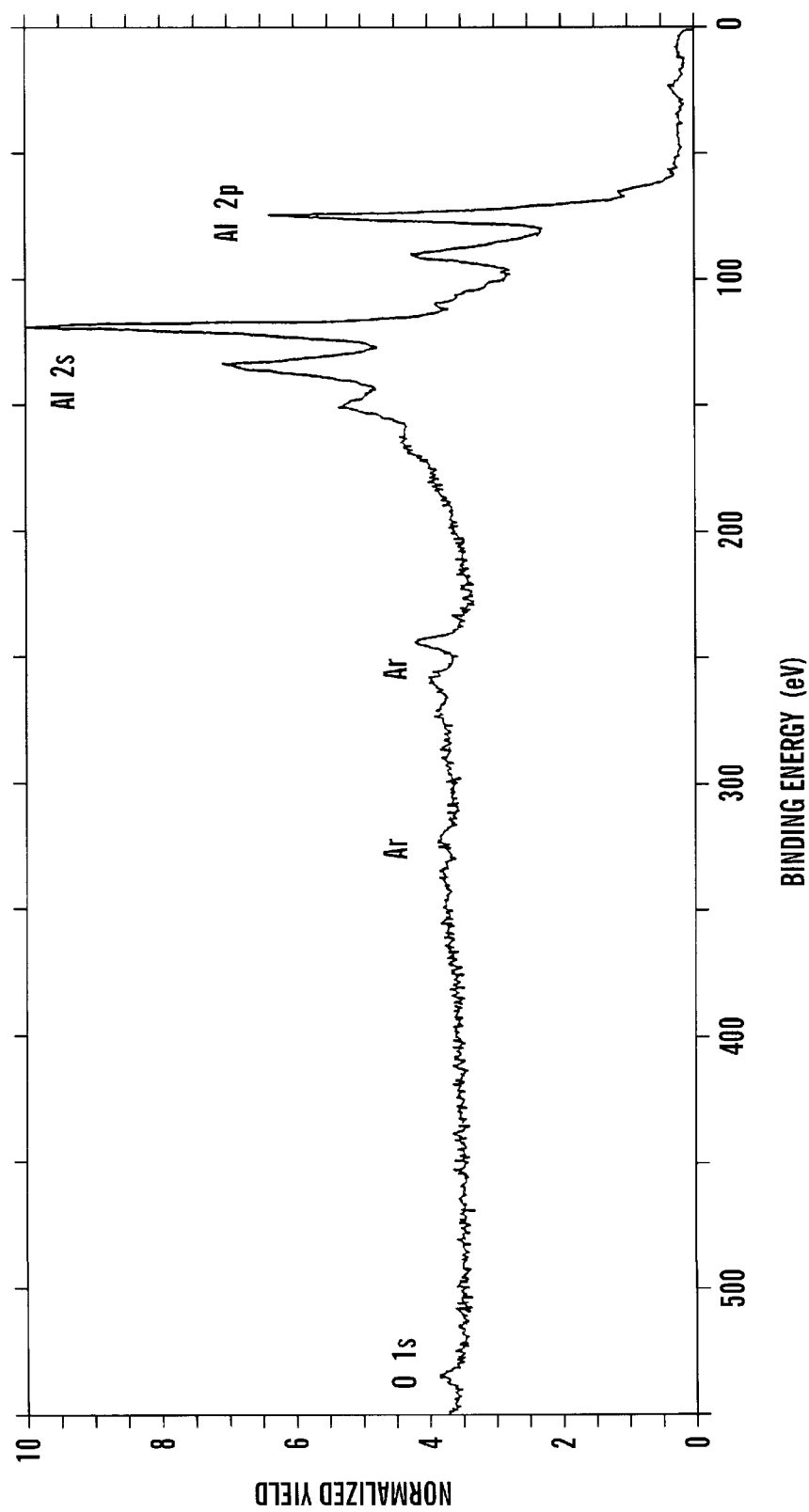
FIG. 3 is an x-ray photoelectron spectroscopy (XPS) of an aluminum film produced by thermal CVD reaction of dimethylethyl aluminum alane (DMEAA) and hydrogen. XPS results indicate a pure Al phase with no light element (e.g., C, O, F, etc.) contamination.

As illustration of the quality of the films, FIG. 2 shows a depth profile AES spectrum of an aluminum film grown as detailed above. The sample was sputter cleaned before data acquisition, and the results were calibrated using a sputtered aluminum sample. In quantitative AES analysis, one needs a standard of known composition (for example a pure aluminum thin film deposited by sputtering) to use as a baseline in determining the concentrations of Al and impurities, if any, which are present in the CVD grown sample. In this case, the "standard" (i.e., sputtered sample of known composition) is analyzed at the same time as the "unknown" (i.e., the CVD sample) under identical conditions and the resulting signal from the standard is employed to "quantify" the signal from the unknown. The choice of a standard of composition and chemical environment and bonding similar to that of the CVD film allowed high accuracy in AES analysis. The results are based on the expectation that chemical and structural changes, if any, induced during the sputter cleaning process are basically the same in the standard and CVD produced films. The AES survey spectrum (FIG. 2) indicated that, within the detection limits of AES, the Al films were free of oxygen, carbon, and similar light element contaminants. Four point resistivity probe measurements yielded a resistivity value of 3.4 $\mu\Omega$cm.

The reactions in thermal Al CVD are quite complex because of the dynamic, non-equilibrium environment which characterizes CVD processing. This complexity is enhanced by the use of a plasma in the case of PPCVD. Accordingly, one can only provide general guidelines or "models" on the most likely reactions that might be taking place. For instance, in the case of thermal CVD from DMEAA, M. E. Gross et al. (M. E. Gross, K. P. Cheung, C. G. Fleming, J. Kovalchick, and L. A. Heimbrok, *J. Vac. Sci. Tehnolo.* A9 (1991) 1), proposed the following model:

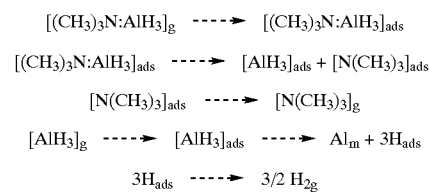

where the subscripts ads, g, and m correspond to, respectively, absorbed (on the substrate surface), gaseous (i.e., in the gas phase), and metallic (i.e., actual film). Similar models exist for DMAH.

The thermal CVD method disclosed above can also be used to deposit layers of copper. Alternate layers of copper aluminum are deposited and the annealed in-situ to provide a layer of copper doped aluminum. Annealing is done for 100 minutes at 450° C. in a hydrogen ambient at a working pressure of 50–250 torr. A typical CVD copper deposition is summarized as follows:

| Source | $Cu^1$(hfac) (trimethylvinylsilane, "tmvs") |
| --- | --- |
| Delivery Rates (liquid) | 0.05 to 5.0 cc/min |
| Working Pressure | 50–5000 mtorr |
| Carrier Gas | None |
| Reactant | $H_2$ (25–2000 sccm) |
| Vaporization T. | 20–60° C. |
| Substrate T | 120–350° C. |
| Substrate Bias | 0–100 W |

Where hfac=hexafluoroacetylacetonate and tmvs=trimethyl vinyl silane

EXAMPLE 2

Preparation of Al Films by Thermal CVD using DMEAA and $H_2$

According to another preferred embodiment, the CVD reactor shown in FIG. 1 was again employed for the deposition of Al from the chemical source dimethylethylamine alane (DMEAA), instead of DMAH. The runs were performed under processing conditions similar to those listed above for DMAH, except for the temperature of the bubbler/sublimator which was heated in this case to temperatures between 20 and 50° C. during the CVD process. Similarly, all transport and delivery lines and high vacuum isolation valves were maintained at temperatures in the range 20 to 60° C., using a combination heating tape and associated power supply, to prevent precursor recondensation. The Al films produced by CVD of DMEAA were again metallic, continuous, and silver colored for films with thicknesses below 2000 Å. Analyses by x-ray diffraction (XRD), x-ray photoelectron spectroscopy (XPS), Rutherford backscattering (RBS), four point probe, and cross-sectional SEM (CS-SEM), indicated that their structural, chemical, and electrical properties are equivalent to those produced by CVD of DMEAA except for film resistivities, which were as low as 3.2 $\mu\Omega$cm in this case. AES survey spectrum (FIG. 1) indicated that, within the detection limits of AES, the Al films were free of oxygen, carbon, and light element contaminants. Typical deposition conditions and film properties are summarized in Tables I and II for films produced by thermal CVD from, respectively, DMAH and DMEAA with no biased substrate.

TABLE I

Typical Non-biased Thermal CVD Deposition Conditions for Al films

| Source | DMAH | DMEAA |
| --- | --- | --- |
| Working Pressure | 100–2500 mtorr | 100–2000 mtorr |
| Carrier Gas | None | None |
| Reactant | $H_2$ (100–2000 sccm) | $H_2$ (100–2000 sccm) |
| Vaporization T | 20–70° C. | 20–50° C. |
| Substrate T | 120–450° C. | 70–450° C. |
| Substrate Bias | 0 W | 0 W |
| Precursor Flow | 1–10 sccm | 1–10 sccm |

TABLE II

Typical Properties of Non-Biased Thermal CVD Deposited Al films

| Source | DMAH | DMEAA |
| --- | --- | --- |
| Purity | >99 at % Al | >99 at % Al |
| As deposited $\rho$ | as low as 3.4 $\mu\Omega$cm | as low as 3.2 $\mu\Omega$cm |
| Adherence | Good on Si, $SiO_2$ & TiN | Good on Si, $SiO_2$ & TiN |
| Color | Silver | Silver |
| Structure | Polycrystalline | Polycrystalline |

*Film properties are given at optimum flow conditions

EXAMPLE 3

Preparation of Al Films by PPCVD with Biased Substrate using DMEAA and $H_2$ According to yet one preferred embodiment, the CVD reactor shown in FIG. 1 was employed for the PPCVD with biased substrate deposition of Al from dimethylethylamine alane (DMEAA). The DMEAA precursor 10 was placed in the bubbler/sublimator 11 which was heated by a combination constant temperature oil bath and associated power supply 12 to temperatures between 20 and 50° C. during the CVD process. An MKS Model 1150 hot source mass flow controller 16, which can be isolated from the bubbler by a high vacuum valve 18, controlled a flow of 0–10 sccm of the DMEAA precursor into the CVD reactor. All transport and delivery lines and high vacuum isolation valves 18, 19, and 20 were maintained at temperatures in the range 30 to 60° C., using a combination heating tape and associated power supply 21 and 22, to prevent precursor recondensation.

The reactor was an 8" wafer, cold wall aluminum CVD reactor. It was equipped with a parallel plate type plasma configuration made of two electrodes 26 and 27 with the reactor itself providing electrical grounding. The upper plate 26 served as the active electrode and was driven by the radio frequency (13.56 MHz) power supply 28. It was constructed in a "mesh" type pattern to allow unconstricted reactant flow to the substrate. A hydrogen plasma was used for in-situ pre-deposition substrate cleaning at plasma power densities in the range 0.05–0.25 W/$cm_2$. Hydrogen plasma densities in the range 0.005 to 0.025 W/$cm_2$ were employed during actual deposition. The substrate (wafer) was placed on the lower electrode 27 which was biased by a low frequency power supply 31 at frequencies in the range 90–450 kHz at powers in the range 0.1–10 W. The substrate was heated to processing temperatures in the range 70–450° C. by an aluminum-encapsulated resistive heater 30.

To guarantee process cleanliness, the reactor was periodically baked under a hydrogen atmosphere to below 0.2 Torr and then pumped down to below $10^{-7}$ Torr for an hour at 150° C. The pumping stack 32 consisted of two pumping packages, the first is turbomolecular pump based, and the second roots blower pump based, and was isolated from the reactor by the high vacuum gate valve. The turbomolecular pump based package was used to ensure high vacuum base pressure in the reactor, while the roots blower based package was employed for appropriate handling of the high gas throughput during actual CVD runs. A high vacuum load lock system was used for transport and loading of 8" wafers into the reactor. Finally, a side line 25 was employed to feed the hydrogen gas into the reactor. The $H_2$ flow of 100 to 1000 sccm was controlled by a mass flow controller 23 and associated isolation valve 24.

Figure 4:
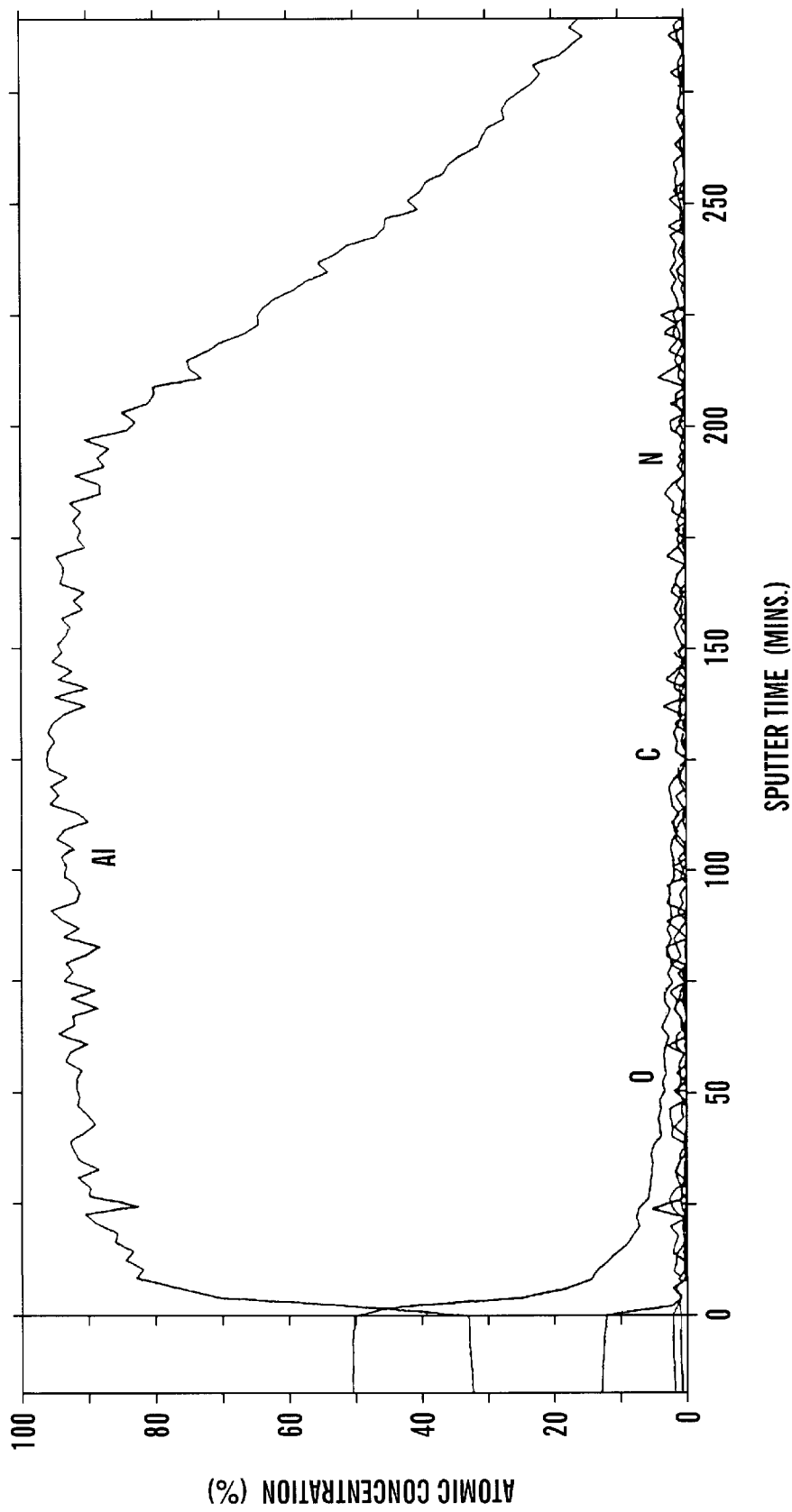
FIG. 4 is an x-ray photoelectron spectroscopy (XPS) spectrum of an aluminum film produced by plasma-promoted CVD reaction of dimethylethyl aluminum alane (DMEAA) and hydrogen with biased substrate. XPS results indicate a pure Al phase with no light element (e.g., C, O, F, etc.) contamination.

The Al films thus produced were metallic, continuous, and silver colored. Their structural and electrical properties as well as chemical composition, were thoroughly analyzed by x-ray diffraction (XRD), x-ray photoelectron spectroscopy (XPS), four point probe, and cross-sectional SEM (CS-SEM). Typical deposition conditions and associated film properties are summarized in Tables III and for Al films produced by PPCVD with biased substrate from DMEAA. In particular, FIG. 4 exhibits a typical x-ray photoelectron spectroscopy (XPS) spectrum of an aluminum film produced by PPCVD from DMEAA and hydrogen with biased substrate. XPS results indicate a pure Al.

TABLE III

Typical Deposition Conditions for Al films

| Source | DMEAA |
|---|---|
| Working Pressure | 100–2000 mtorr |
| Reactant | $H_2$ (100–1000 sccm) |
| Vaporization T | 20–50° C. |
| Substrate T | 70–450° C. |
| Plasma Power Density | 0.005–0.025 W/cm$^2$ |
| Bias Power | 0.1–10 W @ 100–450 kHz |
| Precursor Flow | 1-10 sccm |

TABLE IV

Typical Properties of Al films*

| Property | As deposited | After Annealing** |
|---|---|---|
| Source | DMEAA | DMEAA |
| Purity | >99% Al | >99% Al |
| Resistivity | ~4.2 μΩcm | 3.2–3.4 μΩcm |
| Adherence | Good on Si, SiO$_2$ & TiN | Good On Si, SiO$_2$ & TiN |
| Color | Metallic Silver | Metallic Silver |
| Structure | Polycrystalline | Polycrystalline |

Figure 5:
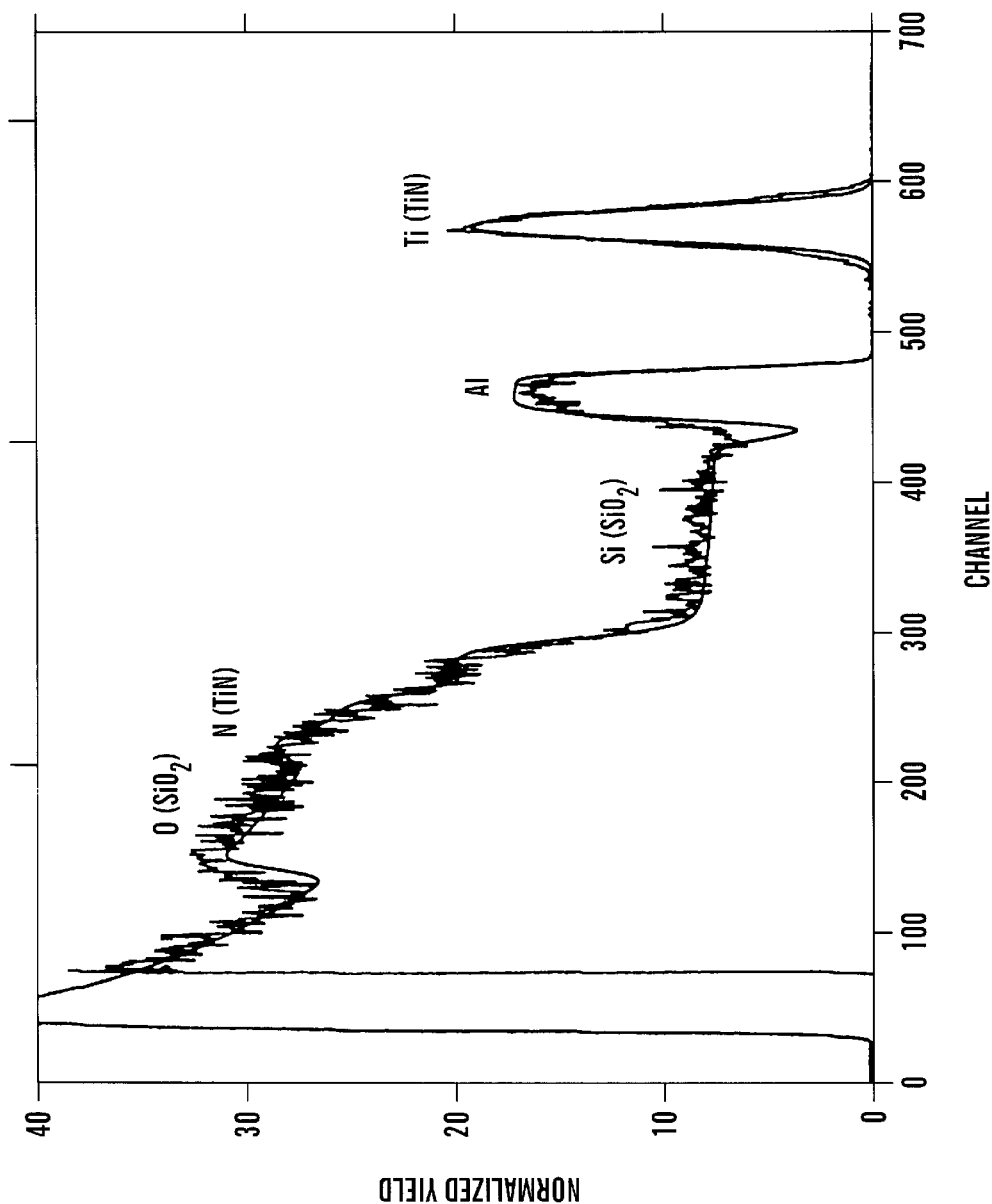
FIG. 5 is a Rutherford backscattering (RBS) spectrum of an aluminum film produced by plasma-promoted CVD reaction of dimethylethyl aluminum alane (DMEAA) and hydrogen with biased substrate. RBS results indicate a pure Al phase with no contamination.
Figure 6:
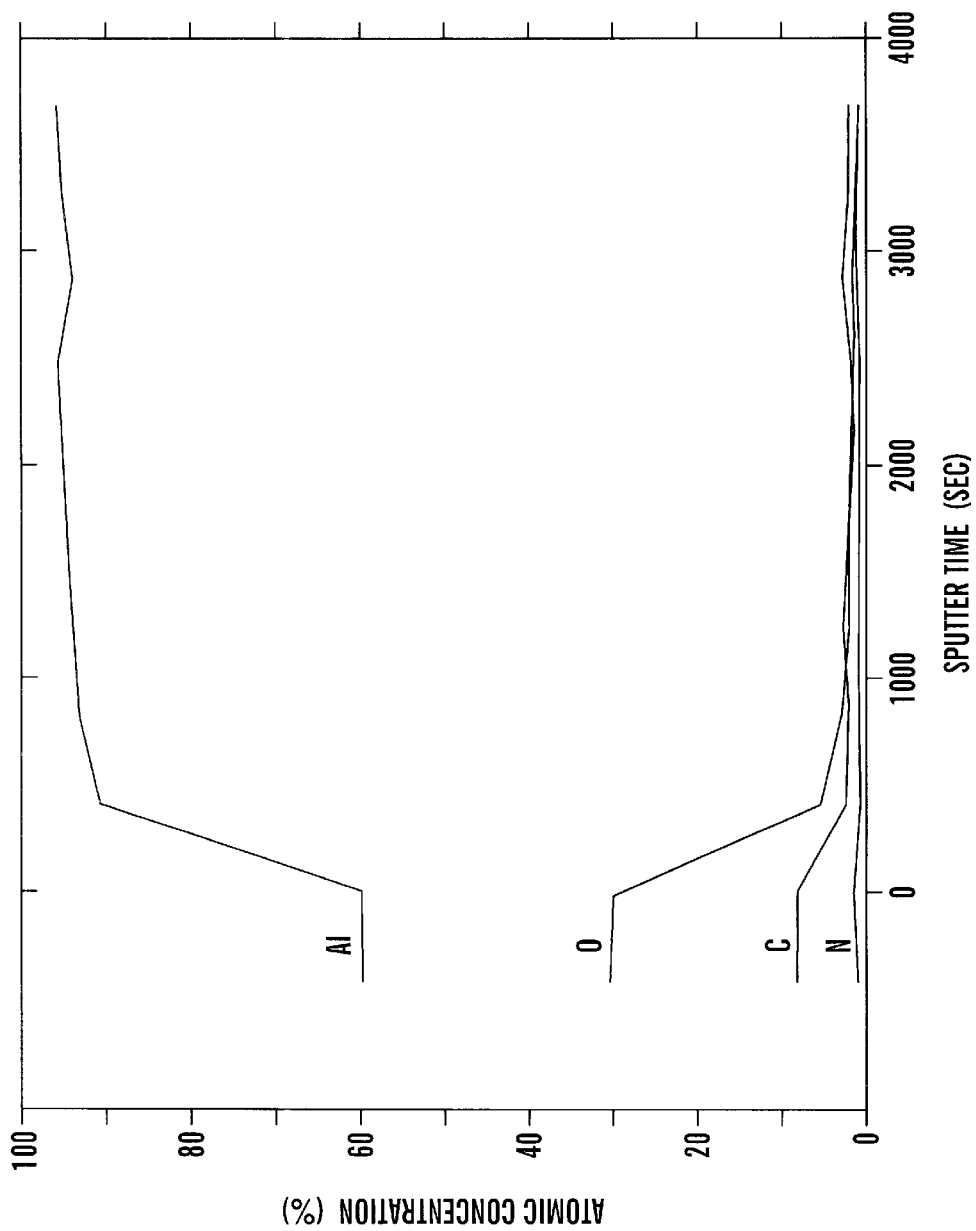
FIG. 6 is an Auger electron Spectroscopy (AES) spectrum of an aluminum film produced by plasma-promoted CVD reaction of dimethylethyl aluminum alane (DMEAA) and hydrogen with biased substrate. AES results indicate a pure Al phase with no light element (e.g., C, O, F, etc.) contamination.

*Film properties are given at optimum flow conditions.
**@ 450° C. for 1 hour 40 minutes in a hydrogen atmosphere.

phase with no light element (e.g., C, O, F, etc.) contamination. Also, FIG. 5 is a Rutherford backscattering (RBS) spectrum of the same aluminum film. RBS results also indicate a pure Al phase with no contamination. The XPS and RBS results were confirmed with Auger electron Spectroscopy (AES), as shown in the AES spectrum in FIG. 6 of an aluminum film produced by PPCVD from DMEAA and hydrogen with biased substrate. AES results also indicate a pure Al phase with no light element (e.g., C, O, F, etc.) contamination.

EXAMPLE 4

Preparation of Al by Thermal CVD with Biased Substrate using DMEAA and $H_2$

According to yet one preferred embodiment, the CVD reactor shown in FIG. 1 was employed for thermal CVD aluminum with biased substrate using dimethylethylamine alane (DMEAA) as the aluminum source. The DMEAA precursor was placed in the bubbler/sublimator which was heated by a combination constant temperature oil bath and associated power supply to temperatures between 20 and 40° C. during the CVD process. An MKS Model 1150 hot source mass flow controller, which can be isolated from the bubbler by a high vacuum valve, controlled a flow of 0–10 sccm of the DMEAA precursor into the CVD reactor. All transport and delivery lines and high vacuum isolation valves were maintained at temperatures in the range 30 to 60° C., using a combination heating tape and associated power supply, to prevent precursor recondensation.

The reactor was an 8" wafer, cold wall, aluminum CVD reactor. A parallel plate type plasma configuration made of two electrodes was employed with the reactor itself providing electrical grounding. The upper plate served as the active electrode and was driven by the 13.56 MHz radio frequency (rf) power supply. It was constructed in a "mesh" type pattern to allow unconstricted reactant flow to the substrate. A hydrogen plasma was used for in-situ pre-deposition substrate cleaning at plasma power densities in the range 0.05–0.25 W/cm$^2$, while no rf power was applied to the upper plate during actual deposition. The substrate (wafer) was placed on the lower electrode, which was biased by a low frequency power supply at frequencies in the range 90–450 kHz at powers in the range 0.1–10 W. The substrate was heated to processing temperatures in the range 70–450° C. by an aluminum-encapsulated resistive heater.

The cone shaped shower head was employed to ensure proper reactant mixing and uniformity in reactant delivery and flow over 8" wafers. To guarantee process cleanliness, the reactor was periodically baked under a hydrogen atmosphere to below 0.2 Torr and then pumped down to below 10$^{-7}$ Torr for an hour at 150° C. The pumping stack consisted of two pumping packages, the first is turbomolecular pump based, and the second roots blower pump based, and was isolated from the reactor by the high vacuum gate valve. The turbomolecular pump based package was used to ensure high vacuum base pressure in the reactor, while the roots blower based package was employed for appropriate handling of the high gas throughput during actual CVD runs. A high vacuum load lock system was used for transport and loading of 8" wafers into the reactor. Finally, a side line was employed to feed the hydrogen gas into the reactor. The $H_2$ flow Of 100 to 1000 sccm was controlled by a mass flow controller and associated isolation valve.

The Al films thus produced were metallic, continuous, and silver colored. Their structural and electrical properties as well as chemical composition, were thoroughly analyzed by x-ray diffraction (XRD), Auger electron spectroscopy (AES), x-ray photoelectron spectroscopy (XPS), Rutherford backscattering (RBS), four point resistivity probe, and cross-sectional SEM (CS-SEM). The results of these analyses are shown in Tables V and VI.

Figure 7:
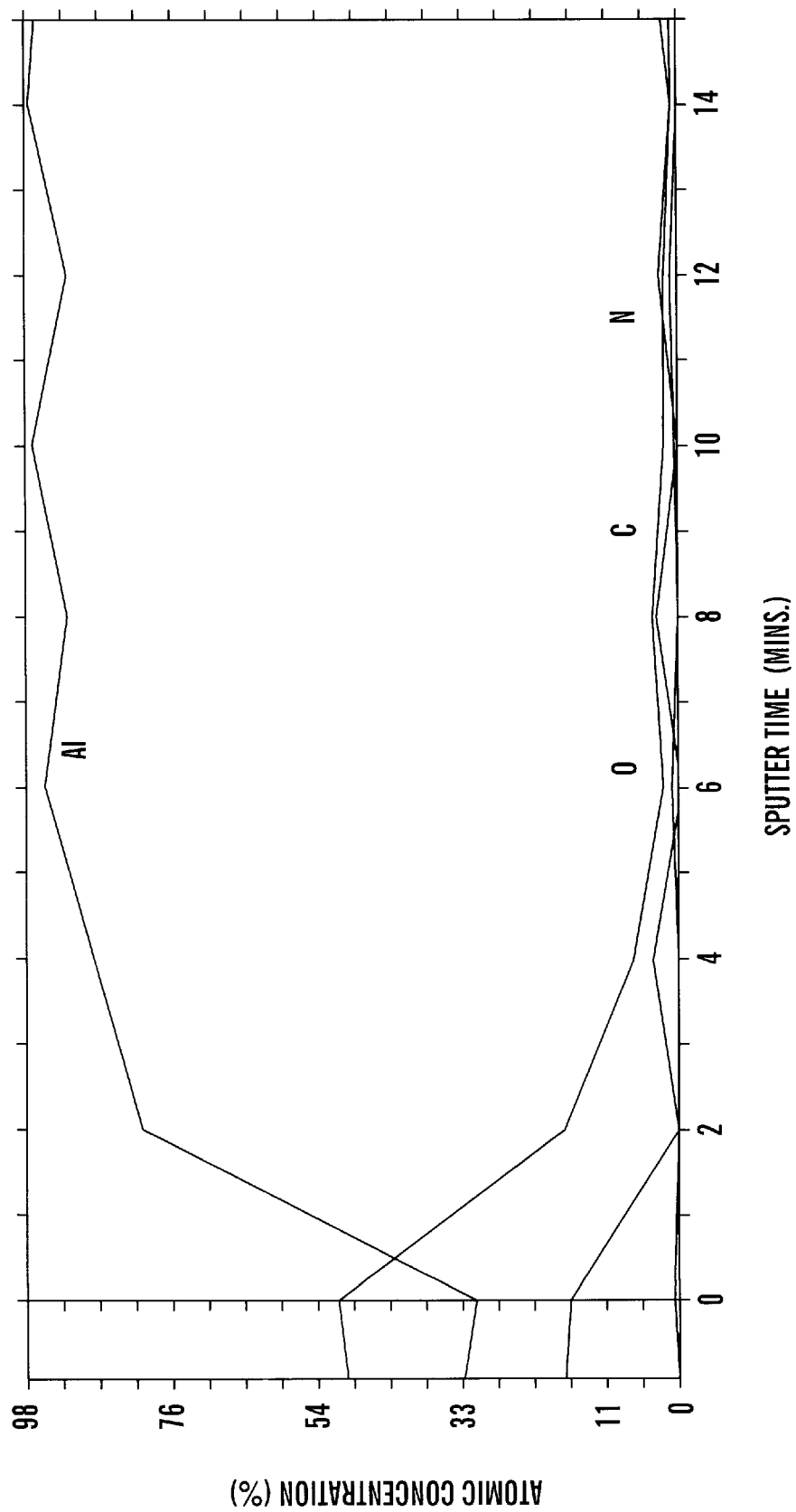
FIG. 7 is an x-ray photoelectron spectroscopy (XPS) spectrum of an aluminum film produced by thermal CVD reaction of dimethylethyl aluminum alane (DMEAA) and hydrogen with biased substrate. AES results indicate a pure Al phase with no light element (e.g., C, O, F, etc.) contamination.

As illustration of the quality of the films, FIG. 7 displays an Auger electron spectroscopy (AES) spectrum of an aluminum film produced by thermal CVD reaction of dimethylethylamine alane (DMEAA) and hydrogen with biased substrate. XPS results indicate a pure Al phase with no light element (e.g., C, O, F, etc.) contamination.

TABLE V

Typical Deposition Conditions for Al films

| Source | DMEAA |
|---|---|
| Working Pressure | 100–2500 mtorr |
| Reactant | $H_2$ (100–1000 sccm) |
| Vaporization T | 20–70° C. |
| Substrate T | 80–175° C. |
| Plasma Power Density | 0.0 |
| Bias Power | 0.1–10 W @ 100–450 kHz |
| Precursor Flow | 1–10 sccm |

TABLE VI

Typical Properties of Al film*

| Property | As deposited | After Annealing** |
|---|---|---|
| Source | DMEAA | DMEAA |
| Purity | >99% Al | >99% Al |
| Resistivity | ~4.2 $\mu\Omega$cm | 3.2–3.4 $\mu\Omega$cm |
| Adherence | Good on Si, SiO$_2$ & TiN | Good On Si, SiO$_2$ & TiN |
| Color | Metallic Silver | Metallic Silver |
| Structure | Polycrystalline | Polycrystalline |

*Film properties are given at optimum flow conditions.
**@ 450° C. for 1 hour 40 minutes in a hydrogen atmosphere.

EXAMPLE 5

In-situ Sequential Preparation of Al/Cu Bilayers by PPCVD using DMEAA/Cu(hfac)$_2$/H$_2$ Followed by in-situ Annealing According to yet one preferred embodiment, the CVD reactor shown in FIG. 1 was employed for the in-situ sequential deposition of Al then Cu layers from, respectively, DMEAA and Cu$^{II}$(hfac)$_2$, where hfac=hexafluoroacetylacetonate. The Al layer was first grown by the PPCVD as described previously in Example 3.

This step was immediately followed in-situ with PPCVD copper. The copper source precursor Cu$^{II}$(hfac)$_2$ 35 is placed in the reservoir (bubbler/sublimator) 36 in FIG. 1 which could be heated by a combination resistance heating tape and associated power supply 37 to a temperature in the range 50–100° C. This temperature range was selected to ensure the sublimation or vaporization of the copper source, while avoiding its premature decomposition. A mass flow controller 38, which can be isolated from the bubbler by a high vacuum valve 39, is used to control the flow of hydrogen carrier gas into the reservoir through inlet 40. This gas served as carrier agent since a conventional pressure based mass flow control type delivery system 41 was employed to control the flow of copper precursor into the CVD reactor 17. The copper delivery system could be isolated from the precursor reservoir by a high vacuum valve 42. The (precursor+carrier gas) mixture vapor is then transported through a high vacuum isolation valve 19 and a cone-shaped shower head 20 into the CVD reactor 17. All transport and delivery lines and high vacuum isolation valves 39, 40, and 42, are maintained at the copper precursor sublimation/vaporization temperature (50–100° C.), using a typical combination of resistance heating tape and associated power supply 43, to prevent precursor recondensation. Ultrathin copper films were grown in-situ on the top of the aluminum films at substrate temperature of 130–200° C., plasma power density of 0.05 to 0.25 W/cm$^2$, zero substrate bias, hydrogen carrier gas flow of 10 to 100 sccm, hydrogen reactant flow of 100–1000 sccm, and reactor working pressure of 100–2000 mtorr. After the copper deposition step was completed, in-situ annealing of the Al and Cu bilayer was performed for 100 minutes at 450° C. in a hydrogen ambient at a working pressure of 50–250 mtorr.

Figure 8:
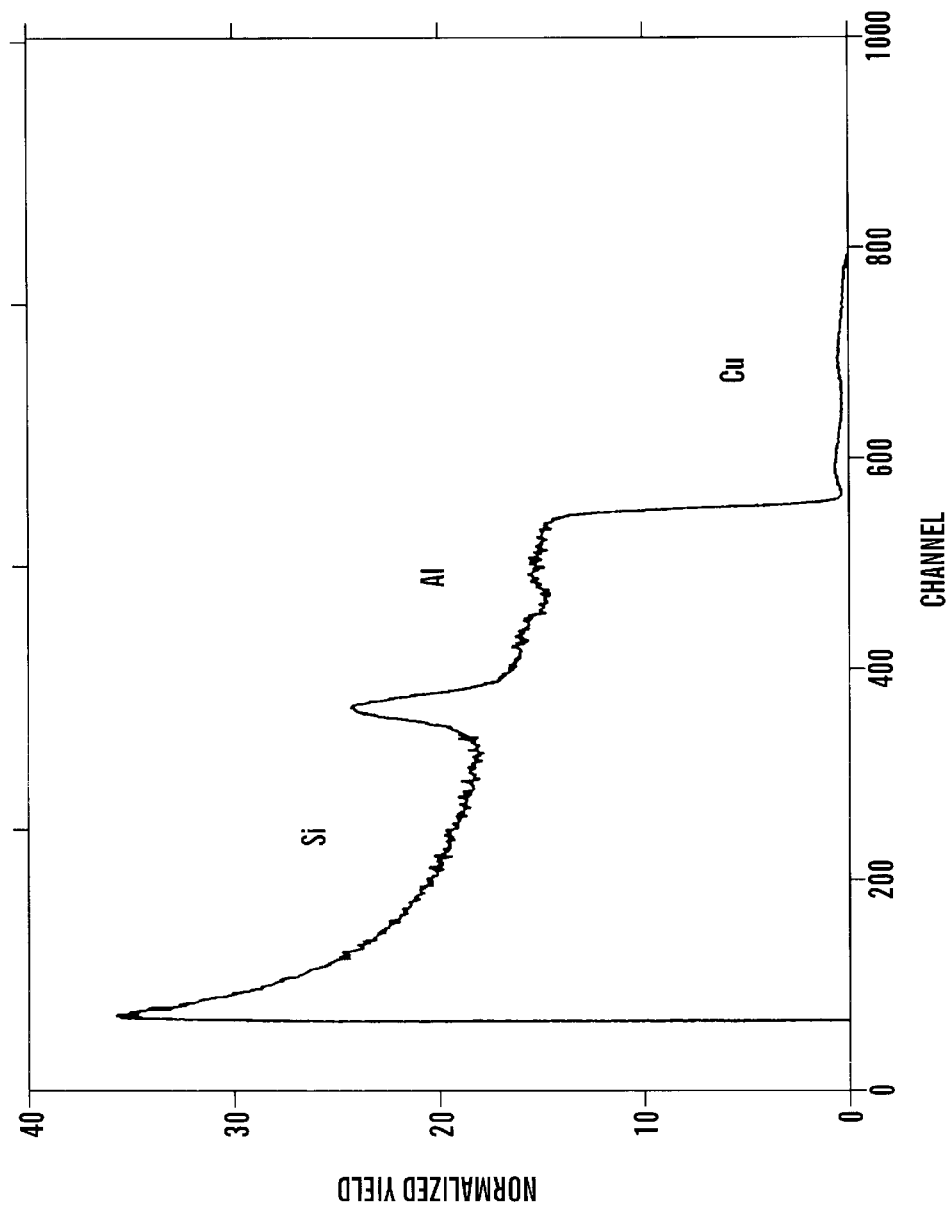
FIG. 8 is a Rutherford backscattering (RBS) spectrum of a copper-doped aluminum film produced by CVD of sequential bilayers of Al and Cu followed by in-situ annealing. RBS results indicate a homogeneous copper distribution throughout the Al phase, with no contamination.

The Cu doped Al films thus produced were metallic, continuous, and silver colored. Their structural and electrical properties as well as chemical composition, were thoroughly analyzed by x-ray diffraction (XRD), Auger electron spectroscopy (AES), x-ray photoelectron spectroscopy (XPS), Rutherford backscattering (RBS), four point resistivity probe, and cross-sectional SEM (CS-SEM). The resulting films were pure aluminum with 0.4 to 0.9 at % copper and as-deposited resistivity of 4.7 $\mu\Omega$cm. As illustration of the quality of the films, FIG. 8 displays a Rutherford backscattering (RBS) spectrum of a copper-doped aluminum film produced by in-situ sequential deposition of Al then Cu layers followed by in-situ annealing. RBS indicated a pure aluminum film with 0.5 at % Cu, with the copper being uniformly distributed across the aluminum film.

EXAMPLE 6

In-situ Simultaneous PPCVD of Al-0.5 at % Cu

According to yet one preferred embodiment, the CVD reactor shown in FIG. 1 was employed for the in-situ simultaneous deposition of Cu doped Al using DMAH and copper n,n'-dimethyl diketenimidate as sources for, respectively, aluminum and copper. The DMEAA precursor 10 was placed in the bubbler/sublimator 11 which was heated by a combination constant temperature oil bath and associated power supply 12 to temperatures between 20 and 40° C. during the CVD process. An MKS Model 1150 hot source mass flow controller 16, which can be isolated from the bubbler by a high vacuum valve 19, controlled a flow of 0–10 sccm of the DMAH precursor into the CVD reactor 17. All transport and delivery lines and high vacuum isolation valves 18, 19, and 20 were maintained at temperatures in the range 30 to 60° C., using a combination heating tape and associated power supply 22, to prevent precursor recondensation.

The copper source precursor Cu n,n'-dimethyl diketenimidate 35 was placed in the reservoir (bubbler/sublimator) 36, which could be heated by a combination resistance heating tape and associated power supply 37 to a temperature in the range 90–175° C. This temperature range was selected to ensure the sublimation or vaporization of the copper source, while avoiding its premature decomposition. A mass flow controller 38, which can be isolated from the bubbler by a high vacuum valve 39, is used to control the flow of hydrogen carrier gas into the reservoir through inlet 40. This gas served as carrier agent since a conventional pressure based mass flow control type delivery system 41 was employed to control the flow of copper precursor into the CVD reactor 17. The copper delivery system could be isolated from the precursor reservoir by a high vacuum valve 42. The (precursor+carrier gas) mixture vapor is then transported through a high vacuum isolation valve 19 and a cone-shaped shower head 20 into the CVD reactor 17. All transport and delivery lines and high vacuum isolation valves 39, 40, and 42, are maintained at the copper precursor sublimation/vaporization temperature (100–200° C.), using a typical combination of resistance heating tape and associated power supply 43, to prevent precursor recondensation.

In-situ copper doped aluminum films were thus grown in-situ at substrate temperature of 130–250° C., plasma power density of 0.05 to 0.25 W/cm$^2$, low frequency substrate bias of 90–200 kHz at 0.1–10 W, hydrogen carrier gas flow of 10–100 sccm for the copper source, hydrogen reactant flow of 100–1000 sccm, and reactor working pressure of 100–2000 mtorr.

The Al films thus produced were metallic, continuous, and silver colored. Their structural and electrical properties as well as chemical composition, were thoroughly analyzed by x-ray diffraction (XRD), Auger electron spectroscopy (AES), x-ray photoelectron spectroscopy (XPS), Rutherford backscattering (RBS), four point resistivity probe, and cross-sectional SEM (CS-SEM). The results of these analyses are shown in Tables V and VI.

Figure 9:
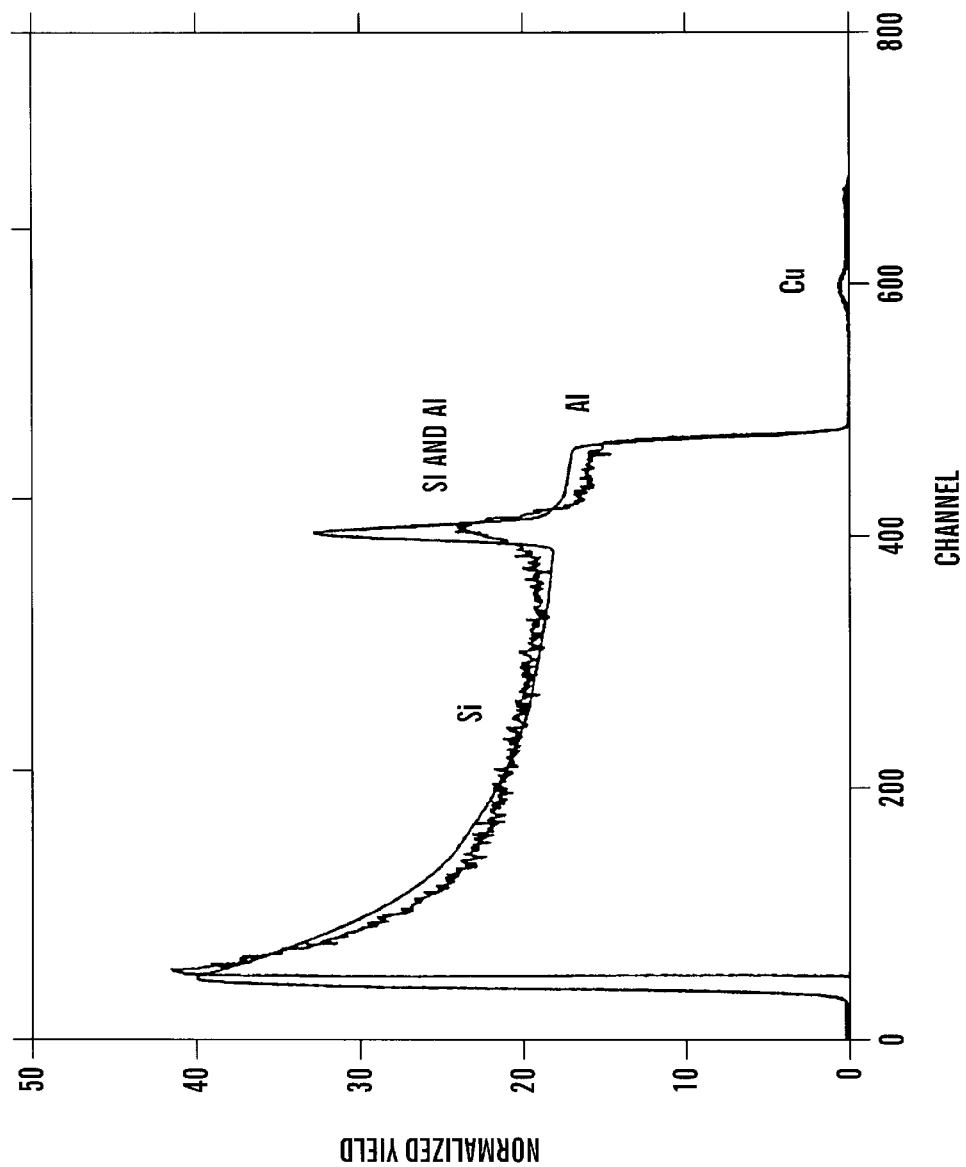
FIG. 9 is a Rutherford backscattering (RBS) spectrum of a copper-doped aluminum film produced by in-situ simultaneous PPCVD deposition from appropriate mixtures of aluminum and copper sources. RBS results indicate a homogeneous copper distribution throughout the Al phase.

The resulting films were aluminum with 0.5 at % copper. As illustration of the quality of the films, FIG. 9 displays a Rutherford backscattering (RBS) spectrum of a copper-doped aluminum film produced by in-situ sequential deposition of Al then Cu layers followed by in-situ annealing. RBS indicated a pure aluminum film with 0.5 at % Cu, with the copper being uniformly distributed across the aluminum film.

In addition to the examples given above, other reactants are compatible with the invention.

The aluminum source precursor employed in the practice of the present invention can be any aluminum-containing compound capable of dissociating to produce elemental aluminum. Examples of suitable aluminum source precursors include aluminum compounds used in conventional CVD processes, such as those described in, for example, C. F. Wan and K. E. Spear, in the Proceedings of the *Seventh International Conference on Chemical Vapor Deposition*, eds. L. F. Donaghey, P. Rai-Chaudhury, R. N. Tauber, Vol. 75–77 (The Electrochem. Soc., Pennington, N.J., 1977) p. 47; C. F. Powell, J. H. Oxley, J. M. Blocher, Jr., *Vapor Deposition* (Wiley, New York, N.Y., 1966) p. 277; H. J. Cooke, R. A. Heinecke, R. C. Stern, and J. W. C. Maas, Solid State Technol. 25 (1982) 62; W. Y.-C. Lai, R. Liu, K. P. Cheung, C. Case, L. F. Tz. Kwakman, and D. Huibreqtse, in the Proceedings of the Workshop on Tungsten and Other Advanced Metals for ULSI Applications 1990, eds. G. C. Smith and R. Blumenthal (MRS, Pittsburgh, 1991) p. 169; W. Klemm, E. Voss, and K. Geigersberger, Z. Anorg. Allg. Chemie 256 (1948) 15; A. S. Russel, K. E. Martin, and C. N. Cochran, Am. Chem. Soc. 73 (1951) 1466; R. A. Levy, P. K. Gallagher, R. Contolini, and F. Schrey, J. Electrochem. Soc. 133 (1985) 457; R. A. Levy, M. L. Green, and P. K. Gallagher, J. Electrochem. Soc. 131 (1985), 457; V. H. Houlding and D. E. Coorn, in the Proceedings of the *Workshop on Tungsten and Other Advanced Metals for ULSI Applications* 1990, eds. G. C. Smith and R. Blumenthal (MRS, Pittsburgh, 1991), p. 203; M. D. Gross, K. P. Cheung, C. G. Fleming, J. Kovalchick, and L. A. Heimbrok, J. Vac. Sci. Technolo. A9 (1991) 1.

One suitable aluminum source precursor is trialkyl aluminums or dialkylaluminum hydrides having the formula $AlR^1R^2R^3$. In this formula, $R^1$ and $R^2$ are alkyl and $R^3$ is either, H or alkyl, or aryl. Alkyl groups can be substituted or unsubstituted and can be branched or straight. Examples of suitable alkyls include but are not limited to methyl, ethyl, n-propyl, isopropyl, n-butyl, isobutyl, and tert-butyl. Suitable substituted alkyl groups include fluorinated alkyls, such as fluoromethyl, difluoromethyl, and perfluoromethyl, perfluoroethyl, perfluoroisobutyl, and the like.

Aryl groups can be substituted or unsubstituted and can be monocyclic or polycyclic. Examples of suitable aryls include phenyl and naphthyl. Suitable substituted aryl groups include fluorinated aryls, such as 4-fluorophenyl and perfluorophenyl, alkylated aryls, such ar tolyl, 4-ethylphenyl, 4-(perfluoroethyl)-phenyl, and the like.

$R^1$, $R^2$, and $R^3$ can be different, such as where dimethylethylaluminum, methylethylaluminnum hydride, dimethylphenylaluminum, methylphenylaluminum hydride, methylethylisopropylaluminum, and methylisobutyl aluminum hydride are used as aluminum source precursors. However, because of their commercial availability, trialkylaluminum source materials where $R^1$, $R^2$, and $R^3$ are the same, such as trimethylaluminum, triethylaluminum, tri-n-propylaluminum, tri-isopropylaluminum, tri-n-butylaluminum, tri-isobutylaluminum, and tri-tert-butylaluminum, triphenylaluminum, are preferred. Where dialkylaluminum hydrides are employed, preferred aluminum source precursors are those in which $R^1$, and $R^2$, are the same, such as dimethylaluminum hydride, diethylaluminum hydride, di-n-propylaluminum hydride, di-isopropylaluminum hydride, di-n-butylaluminum hydride, di-isobutylaluminum hydride, di-tert-butylaluminum hydride, and diphenylaluminum hydride.

Another class of compounds suitable for use as an aluminum source precursors in practicing the methods of the present invention include the aluminum halides having the formula $AlX^1X^2X^3$. In this formula, $X^1$, $X^2$, and $X^3$ can be the same or different and can be F, Cl, Br, or I. Illustrative aluminum halides include aluminum trifluoride, aluminum trichloride, aluminum tribromide, aluminum triiodide, diflourochloroaluminunum, dichlorofluoroaluminum, difluorobromoaluminum, fluorodibromoaluminum, dichlorobromoaluminum, and fluorochlorobromoaluminum.

The aluminum source precursor can also be an aluminum tris(β-diketonate), such as those having the formula $Al(R^1COCHCOR^2)_3$. $R^1$ and $R^2$ are the same or different and are selected from the group consisting of alkyl, aryl, halogenated alkyl, or halogenated aryl. Alkyl groups can be, for example, methyl, ethyl, or branched or straight chain propyl, butyl, pentyl, or hexyl. Aryl groups include, for example, phenyl, tolyl, naphthyl, and the like. Halogenated alkyls and halogenated aryls include alkyl and aryl groups substituted with one or more halogen atoms, such as fluorine, chlorine, bromine, iodine, or combinations of these. Suitable $R^1$ and $R^2$ include $CH_3$, $CF_3$, $C_2H_5$, $C_2F_5$, n-$C_3H_7$, n-$C_3F_7$, iso-$C_3H_7$, iso-$C_3F_7$, n-$C_4H_9$, n-$C_4F_9$, iso-$C_4H_9$, iso-$C_4F_9$, tert-$C_4F_9$, tert-$C_4F_9$, $C_6H_5$, and $C_6F_5$. Although it is preferred (from the standpoint of preparing the aluminum source precursors) that all of the three β-diketonate groups contain the same $R^1$ and $R^2$ combination, the three β-diketonate groups need not be the same, such as, for example, where the aluminum source precursor is $Al(CH_3COCHCOCF_3)_2(C_2H_5COCHCOCF_3)$.

Alkyl amide aluminums having the formula $(H_2Al:NR^1R^2)_3$ can also be used as aluminum source precursors. In this formula, $R^1$ and $R^2$ are the same or different and are alkyl, such as methyl, ethyl, n-propyl, isopropyl, n-butyl, isobutyl, tert-butyl, and the like.

Trialkylamine alanes, having the formula $H_3Al:NR^1R^2R^3$, can also be used as aluminum source precursors in practicing the methods of the present invention. In this formula, $R^1$, $R^2$, and $R^3$ are either alkyl or aryl. Alkyl groups can be substituted or unsubstituted and can be branched or straight. Examples of suitable alkyls include but are not limited to methyl, ethyl, n-propyl, isopropyl, n-butyl, isobutyl, and tert-butyl. Suitable substituted alkyl groups include fluorinated alkyls, such as fluoromethyl, difluoromethyl, perfluoromethyl, perfluoroethyl, perfluoroisobutyl, and the like. Aryl groups can be substituted or unsubstituted and can be monocyclic or polycyclic. Examples of suitable aryls include phenyl and naphthyl. Suitable substituted aryl groups include fluorinated aryls, such as 4-fluorophenyl and perfluorophenyl; alkylated aryls, such ar tolyl, 4-ethylphenyl, or 4-(perfluoroethyl)-phenyl; and the like. $R^1$, $R^2$, and $R^3$ can be different, such as where dimethyletylamine alane, methyldiethylamine alane, dimethylisobutylamine alane, dimethylphenylamine alane, and methylethylisopropylamine alane, are used as aluminum source precursors. Alternatively, $R^1$, $R^2$, and $R^3$ can be the same, such as trimethylamine alane, triethylamine alane, tri-n-propylamine alane, tri-isopropylamine alane, tri-n-butylamine alane, tri-isobutylamine alane, and tri-tert-butylamine alane, and triphenylamine alane.

One may also substitute other reactant gases for hydrogen, including a gas selected from the group consisting of helium, argon, xenon, nitrogen, or a mixture thereof. Such selected reactants and aluminum precursors may be used with plasma processes selected from the group consisting of radio frequency plasma, low frequency plasma, high density plasma, electron cyclotron resonance (ECR) plasma, or inductively coupled plasma (ICP). An electrical bias is applied to the substrate using direct current (dc), low-frequency alternating current (90–45-kHz), or radio frequency (rf) bias.

In connection with the deposition of copper, one may use one of a number of techniques including but not limited to reactive ion sputtering, direct current (dc) sputtering, collimated sputtering, thermal chemical vapor deposition (CVD), plasma-promoted CVD (PPCVD), or PPCVD with bias substrate.

What is claimed is:

1. A chemical vapor deposition process for the in-situ preparation of a conformal layer comprising aluminum on a substrate in a reactor comprising the steps of:
   a. applying an electrical bias to the substrate;
   b. heating the substrate to a temperature of less than 500° C.;
   c. generating a vapor flow of at least one aluminum source precursor vapor;
   d. optionally forming a plasma having a power density of 0.005 to 0.025 W/cm$^2$ within the reactor; and
   e. depositing on the substrate a coating comprising a first conformal layer comprising aluminum.

2. The process of claim 1, wherein the plasma having a power density ranging from 0.005 W/cm$^2$ to 0.025 W/cm$^2$ is formed.

3. The process of claim 2, wherein the plasma is selected from the group consisting of radio frequency plasma, low frequency plasma, electron cyclotron resonance (ECR) plasma, and inductively coupled plasma (ICP).

4. The process of claim 1, wherein the electrical bias has a power density ranging from 0.0003 W/cm$^2$ to 0.031 W/cm$^2$.

5. The process of claim 1, wherein the vapor flow additionally comprises a gas chosen from hydrogen, helium, argon, xenon, nitrogen, ammonia or a mixture thereof.

6. The process of claim 1, wherein the substrate is biased by an alternating current.

7. The process of claim 6, wherein the alternating current has a frequency chosen from 90–450 khz and radio frequency.

8. The process of claim 1, additionally comprising the step of generating a flow of at least one copper source precursor vapor, and wherein the coating comprises a first conformal layer comprising aluminum and copper.

9. The process of claim 8, wherein the coating contains less than 10 atomic percent copper.

10. The process of claim 8, wherein said copper source precursor is selected from the group consisting of copper (I)-tert-butoxide-tetramers, cyclopentadienyl copper (I)-phosphine compounds, ligand stabilized copper (I) β-diketonates, copper (II) β-diketonates and copper ketenimidates.

11. The process of claim 8, wherein said copper source precursor is copper N,N'-dimethylketenimidate.

12. The process of claim 8, wherein said copper source precursor is copper (II) hexafluoroacetylacetonate.

13. The process of claim 1, additionally comprising the step of generating a flow of at least one copper source precursor vapor, and wherein the coating comprises a second conformal layer comprising copper over the first conformal layer comprising aluminum.

14. The process of claim 13, additionally comprising the step of annealing the first and second conformal layers to form a single conformal layer comprising a copper/aluminum alloy.

15. The process of claim 1, wherein said aluminum source precursor is a trialkyl aluminum or a dialkyl aluminum hydride.

16. The process of claim 15, wherein said alkyl is selected from the group consisting of methyl, ethyl, n-propyl, isopropyl, n-butyl, isobutyl, and tert-butyl.

17. The process of claim 15, wherein said aluminum source precursor is diethylaluminum hydride, dimethylaluminum hydride, or ethylmethylaluminum hydride.

18. The process of claim 11, wherein said aluminum source precursor is an aluminum halide.

19. The process of claim 18, wherein the aluminum halide is aluminum trichloride, aluminum tribromide, or aluminum triiodide.

20. The process of claim 1, wherein said aluminum source precursor is an aluminum tris(β-diketonate).

21. The process of claim 1, wherein said aluminum source precursor is a trialkylamine alane.

22. The process of claim 21, wherein said aluminum source precursor is triethylamine alane, trimethylamine alane, diethylmethylamine alane, or dimethylethylamine alane.

23. A chemical vapor deposition process for the in-situ preparation of a conformal layer comprising aluminum on a substrate in a reactor comprising the steps of:
   a. applying to the substrate an electrical bias having a power density of 0.031 W/cm$^2$;
   b. heating the substrate to a temperature of 70–250° C.;
   c. generating a flow of an aluminum source precursor vapor chosen from dimethylethylaluminum alane and dimethylaluminum hydride;
   d. forming a plasma having a power density of 0.025 W/cm$^2$ within the reactor; and
   e. depositing on the substrate a coating comprising a first conformal layer comprising aluminum.

24. The process of claim 23, additionally comprising the step of generating a flow of a copper source precursor vapor chosen from copper (II) hexafluoroacetylacetonate and copper N-N'-dimethylketenimidate, wherein the first conformal layer additionally comprises copper.

25. The process of claim 23, additionally comprising the step of generating a flow of a copper source precursor vapor chosen from copper (II) hexafluoroacetylacetonate and copper N-N'-dimethylketenimidate, wherein the coating comprises a second conformal layer comprising copper over the first conformal layer.

* * * * *

UNITED STATES PATENT AND TRADEMARK OFFICE
CERTIFICATE OF CORRECTION

PATENT NO. : 6,077,571
DATED : June 20, 2000
INVENTOR(S) : Kaloyeros et al.

It is certified that error appears in the above-identified patent and that said Letters Patent is hereby corrected as shown below:

<u>Claim 18, column 20</u>,
Line 23, delete "11" and replace with -- 1 --.

Signed and Sealed this

Second Day of October, 2001

Attest:

*Nicholas P. Godici*

NICHOLAS P. GODICI
*Attesting Officer*  *Acting Director of the United States Patent and Trademark Office*